US007988875B2

(12) United States Patent
Choi et al.

(10) Patent No.: US 7,988,875 B2
(45) Date of Patent: Aug. 2, 2011

(54) DIFFERENTIAL ETCH RATE CONTROL OF LAYERS DEPOSITED BY CHEMICAL VAPOR DEPOSITION

(75) Inventors: Soo Young Choi, Fremont, CA (US); Gaku Furuta, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 800 days.

(21) Appl. No.: 12/027,964

(22) Filed: Feb. 7, 2008

(65) Prior Publication Data
US 2008/0190886 A1    Aug. 14, 2008

Related U.S. Application Data

(60) Provisional application No. 60/888,940, filed on Feb. 8, 2007.

(51) Int. Cl.
*C23F 3/00* (2006.01)

(52) U.S. Cl. .................. 216/80; 216/2; 216/39; 216/46; 216/67; 438/791; 438/792; 118/724

(58) Field of Classification Search .................... 216/80, 216/2, 39, 46, 67; 438/791, 792; 118/724
See application file for complete search history.

(56) References Cited

U.S. PATENT DOCUMENTS

| 4,724,323 A | 2/1988 | Fukaya et al. |
| 4,746,535 A | 5/1988 | Fukaya et al. |
| 4,763,010 A | 8/1988 | Fukaya et al. |
| 4,863,755 A | 9/1989 | Hess et al. |
| 5,135,607 A | 8/1992 | Hirai |
| 5,319,479 A | 6/1994 | Yamada et al. |
| 5,342,452 A | 8/1994 | Saito et al. |
| 5,399,387 A | 3/1995 | Law et al. |
| 5,674,599 A | 10/1997 | Yamada |
| 5,681,775 A * | 10/1997 | Pogge ........................... 438/406 |

(Continued)

FOREIGN PATENT DOCUMENTS
EP    1 168 427    1/2002

OTHER PUBLICATIONS

E.J. Kim, et al., "Modeling of SiO2 CVD From TEOS/Ozone in a Separate-Gas-Injection Reactor," Korean J. Chem. Eng., vol. 15, No. 1, pp. 56-63 (1998).

(Continued)

*Primary Examiner* — Lan Vinh
*Assistant Examiner* — Maki A Angadi
(74) *Attorney, Agent, or Firm* — Patterson & Sheridan, L.L.P.

(57) ABSTRACT

A method and apparatus is provided for controlling the etch profile of a multilayer layer stack by depositing a first and second material layer with differential etch rates in the same or different processing chamber. In one embodiment of the invention, a process for etching substrate material is provided including depositing a first silicon-containing material layer having a first etch rate on the substrate surface from a nitrogen-containing precursor at a first flow rate and a silicon-containing precursor, depositing a second silicon-containing material layer having a second etch rate different than the first etch rate on the first silicon-containing material layer from the nitrogen-containing precursor at a second flow rate different than the first flow rate and the silicon-containing precursor, etching the first silicon-containing material layer and the second silicon-containing material layer, and forming a taper etch profile in the first silicon-containing material layer and the second silicon-containing material layer.

25 Claims, 9 Drawing Sheets

U.S. PATENT DOCUMENTS

| | | | |
|---|---|---|---|
| 5,928,732 | A | 7/1999 | Law et al. |
| 6,120,661 | A | 9/2000 | Hirano et al. |
| 6,477,980 | B1 | 11/2002 | White et al. |
| 6,784,108 | B1 * | 8/2004 | Donohoe et al. ............... 438/706 |
| 7,229,896 | B2 * | 6/2007 | Chen et al. .................... 438/435 |
| 7,618,548 | B2 * | 11/2009 | Chinn et al. ....................... 216/2 |
| 2001/0021422 | A1 | 9/2001 | Yamakoshi et al. |
| 2002/0146879 | A1 | 10/2002 | Fu et al. |
| 2002/0160553 | A1 | 10/2002 | Yamanaka et al. |
| 2002/0191660 | A1 | 12/2002 | Wittman et al. |
| 2003/0082859 | A1 | 5/2003 | Ichijo et al. |
| 2006/0019502 | A1 * | 1/2006 | Park et al. ..................... 438/791 |

OTHER PUBLICATIONS

S.K. Kim, et al., "A Novel Self-Aligned Coplanar Amorphous Silicon Thin Film Transistor," ISSN0098-0966X/98/2901 (1998).

L. Kyung-Ha, "A Study on Laser Annealed Polycrystalline Silicon Thin Film Transistors (TFTs) with SiNx Gate Insulator," Kyung Hee University, Ch. 2 & 4 (1998).

Y. Park, "Bulk and Interface Properties of Low-Temperature Silicon Nitride Films Deposited by Remote Plasma Enhanced Chemical Vapor Deposition," Journal of Materials Science: Materials in Electronics, vol. 12, pp. 515-522 (2001).

A. Sazonov, et al., "Low Temperature a-Si:H TFT on Plastic Films: Materials and Fabrication Aspects," Proc. 23rd International Conference on Microelectronics (MIEL 2002), vol. 2, Nis, Yugoslavia (May 2002).

D.B. Thomasson, et al., "High Mobility Tri-Layer a-Si:H Thin Film Transistors with Ultra-Thin Active Layer," 1997 Society for Information Display International Symposium Digest of Technical Papers, vol. 28, pp. 176-179 (May 1997).

* cited by examiner

DIFFERENTIAL ETCH RATE CONTROL OF LAYERS DEPOSITED BY CHEMICAL VAPOR DEPOSITION

CROSS-REFERENCE TO RELATED APPLICATIONS

This application claims benefit of U.S. Provisional Patent Application Ser. No. 60/888,940, filed Feb. 8, 2007, which is incorporated herein by reference.

BACKGROUND OF THE INVENTION

1. Field of the Invention

Embodiments of the invention generally relate to control of layer property over the surface of a substrate useful for fabricating into display devices.

2. Description of the Related Art

For years, cathode ray tube (CRT) technology is used to make devices, such as TV screens or monitors, with great colors and high-quality pictures. Unfortunately, CRT devices are bulky and heavy, and can not be manufactured into large sizes. The demands for flat screens in large size have resulted in great advancement in the technologies of Liquid Crystal Display (LCD), Plasma Display Panels (PDP), Field Emission Display (FED), Organic Light Emitting Diode (OLED), and other flat panel display technologies. Recently, a flat panel screen technology, called Surface-conduction Electron-emitter Display (SED) has also emerged. SED devices use millions of Surface-conduction Electron Emitters (SEC) in miniaturized sizes as electron emitters instead of one big CRT tube Fabrication of these display devices, usually on large area substrates, such as glass substrates, requires deposition and etching of multiple layer layers with each layer serving different function. In general, the substrate for device fabrication is subjected to various processes, such as chemical vapor deposition (CVD), sputtering, physical vapor deposition (PVD), lithography, etching, ion implantation, ashing, cleaning, heating, annealing, and the like in a specific multi-step fabrication sequence to process layers of metal and silicon containing layers thereon. One example of a multilayer layer stack is a thin layer transistor (TFT) structure useful for fabricating LCD and other devices.

Since the structures for various display devices and applications are distinct, it is important to control etch rates and etch profiles for various deposited layers on a surface of a substrate in order to generate a required final structure. FIGS. 1A-1D illustrate etching of a material layer 110 on a surface of a substrate 101 having a typical etching profile without any etching taper angle. As shown in FIG. 1A, the material layer 110 is deposited over the surface of the substrate 101 inside a deposition processing chamber. In FIG. 1B, a photoresist 112 can be deposited in accordance with a desired pattern over the material layer 110 during fabrication of a device structure.

In FIG. 1C, pattern etch is performed on the substrate 101 placed inside an etch chamber or in a wet etch solution to etch the material layer 110 into a feature 150, resulting in side walls 152 of the etched feature of the material layer 110 being straight with an etch angle α of zero degrees. Next, as shown in FIG. 1D, the photoresist 112 can be removed for continued substrate processing and the resulting material layer 110 exhibits a typical straight etch profile over the feature 150. As device structures continues to evolve and vary among different display applications, it is desirable to control etching of a material layer into concave, convex, or taper etch profiles of the features over a defined mesa or pattern.

Therefore, there remains a need for a method and apparatus to process one or more layers with controlled etch profile.

SUMMARY OF THE INVENTION

Embodiments of the invention generally provide a method and apparatus for controlling the etch profile of a multilayer layer stack by depositing two or more material layers each having different etch rates. In one embodiment, a method for controlling the etch profile of a multilayer layer stack by depositing a dual material layer with differential etch rates on a surface of a substrate.

In one embodiment, a method for processing a substrate is provided including depositing a first silicon-containing material layer having a first etch rate on the substrate surface from a nitrogen-containing precursor introduced into a processing chamber at a first flow rate and a silicon-containing precursor, depositing a second silicon-containing material layer having a second etch rate different than the first etch rate on the first silicon-containing material layer from the nitrogen-containing precursor at a second flow rate different than the first flow rate and the silicon-containing precursor, etching the first silicon-containing material layer and the second silicon-containing material layer, and forming a taper etch profile in the first silicon-containing material layer and the second silicon-containing material layer.

In another embodiment of the invention, a method for processing a substrate is provided including depositing a first silicon-containing material layer having a first etch rate on the substrate surface from a nitrogen-containing precursor introduced into a processing chamber at a first flow rate and a silicon-containing precursor, adjusting the flow rate of the of the nitrogen-containing precursor to a second flow rate different than the first flow rate, depositing in situ a second silicon-containing material layer having a second etch rate different than the first etch rate, etching the first silicon-containing material layer and the second silicon-containing material layer, and forming a etch profile in the first silicon-containing material layer and the second silicon-containing material layer an etch angle larger than 0° from the side walls of the etched first silicon-containing material layer to the etched sidewalls of the second silicon-containing material layer.

In another embodiment of the invention, a method for processing a substrate is provided including depositing a first silicon-containing material layer having a first etch rate on the substrate surface from a first nitrogen-containing precursor and a silicon-containing precursor, depositing a second silicon-containing material layer having a second etch rate different than the first etch rate on the first silicon-containing material layer from a second nitrogen-containing precursor and the silicon-containing precursor, etching the first silicon-containing material layer and the second silicon-containing material layer, and forming a etch profile in the first silicon-containing material layer and the second silicon-containing material layer an etch angle larger than 0° from the side walls of the etched first silicon-containing material layer to the etched sidewalls of the second silicon-containing material layer.

In another embodiment, a method of controlling the etch profile of a dual material layer on a surface of a substrate includes depositing a first material layer having a first etch rate on the surface of the substrate in a first chemical vapor deposition processing chamber using a first composition of precursors having a nitrogen-containing precursor at a first amount and a silicon-containing precursor, depositing a second material layer having a second etch rate lower than the first etch rate on the surface of the substrate in a second chemical vapor deposition processing chamber using a second composition of precursors comprising the nitrogen-containing precursor at a second amount lower than the first amount, and forming the dual material layer having the first material layer and the second material layer. The method further include etching the dual material layer to form an etch angle larger than 0° from the side walls of the features of the first material layer and the second material layer and forming a taper etch profile in the dual material layer.

In another embodiment, a method of controlling the etch profile of a dual silicon oxide layer on a surface of a substrate includes depositing a first silicon oxide layer having a first etch rate on the surface of the substrate in a first chemical vapor deposition processing chamber using a first composition of precursors comprising a nitrogen-containing precursor at a first amount and a silicon-containing precursor and depositing a second silicon oxide layer having a second etch rate lower than the first etch rate on the surface of the substrate in a second chemical vapor deposition processing chamber using a second composition of precursors comprising the nitrogen-containing precursor at a second amount lower than the first amount. The dual silicon oxide layer having the first silicon oxide layer and the second silicon oxide layer is formed on the surface of the substrate and the dual silicon oxide layer is wet etched or dry etched to form an etch angle of larger than 0° from the side walls of the features of the first silicon oxide layer and the second silicon oxide layer, thereby forming a taper etch profile in the dual silicon oxide layer.

In still another embodiment, a method of controlling the etch profile of a dual silicon nitride layer on a surface of a substrate includes depositing a first silicon nitride layer having a first etch rate on the surface of the substrate in a first chemical vapor deposition processing chamber using a first composition of precursors comprising a nitrogen-containing precursor at a first amount and a silicon-containing precursor and depositing a second silicon nitride layer having a second etch rate lower than the first etch rate on the surface of the substrate in a second chemical vapor deposition processing chamber using a second composition of precursors comprising the nitrogen-containing precursor at a second amount lower than the first amount. The dual silicon nitride layer having the first silicon nitride layer and the second silicon nitride layer is formed on the surface of the substrate and the dual silicon nitride layer is wet etch or dry etched to form an etch angle larger than 0° between the side walls of the features of the first silicon nitride layer and the second silicon nitride layer, thereby forming a taper etch profile in the dual silicon nitride layer.

In a further embodiment, a substrate processing system having a chemical vapor deposition processing chamber is provided to deposit a dual material layer and controlling the etch profile of the dual material layer. The substrate processing system is adapted to deposit a first material layer having a first etch rate in a first chemical vapor deposition processing chamber using a first composition of precursors comprising a nitrogen-containing precursor at a first amount and a silicon-containing precursor and to deposit a second material layer having a second etch rate lower than the first etch rate in a second chemical vapor deposition processing chamber using a second composition of precursors comprising the nitrogen-containing precursor at a second amount lower than the first amount such that the dual material layer having the first material layer and the second material layer is formed on the surface of a substrate. The substrate processing system further includes an etch chamber and/or a wet etch station to etch the dual material layer to form an etch angle larger than 0° from the side walls of the features of the first material layer and the second material layer and to form a taper etch profile in the dual material layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide a method and apparatus for controlling the etch profile of a material layer by forming two or more material layers with each material layer having different etch rates. FIGS. 2A-2D illustrate forming a stack of two material layers, dual material layer 210, to generate a concave, convex, and/or taper etch profiles in features in accordance with one embodiment of the invention.

Figure 1A:
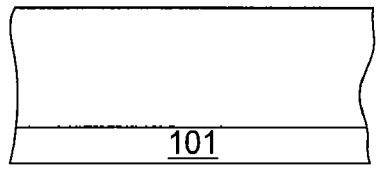
FIGS. 1A-1D are sectional views illustrating prior art processing of a material layer.
Figure 1B:
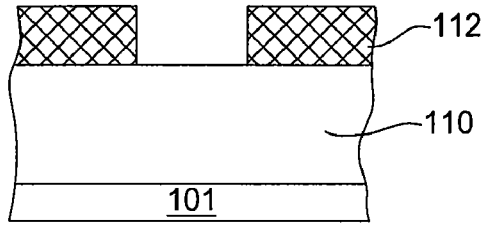
Figure 1C:
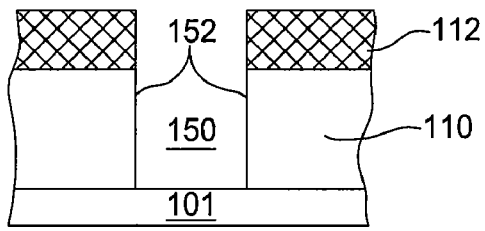
Figure 1D:
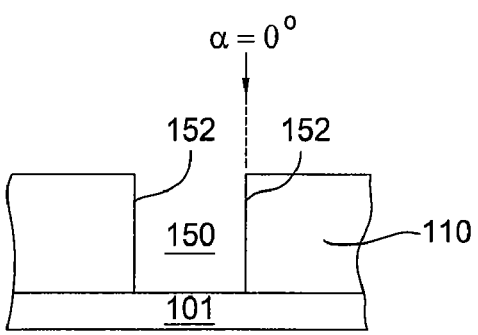
Figure 2A:
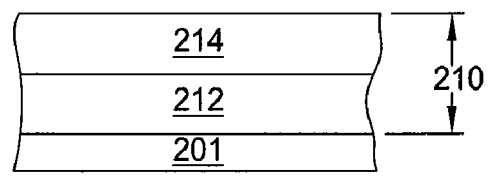
FIGS. 2A-2D are sectional views illustrating processing of a dual material layer with a taper etch profile in accordance with one embodiment of the invention.

In FIG. 2A, the dual material layer 210 is formed by sequentially depositing a first material layer 212 and a second material layer 214 over the surface of the substrate 201. In one embodiment, the first material layer 212 and the second material layer 214 are deposited such that controlled etch rates for the first material layer 212 and the second material layer 214 can be obtained. For example, the etch rate of the first material layer 212 can be controlled to be lower than the etch rate of the second material layer 214 during the deposition of the first material layer 212 and the second material layer 214 by using different precursors and/or adjusting the amounts of precursors used in the deposition process. The first material layer 212 and the second material layer 214 may comprise silicon-containing material layers, for example, silicon oxide, silicon nitride, or silicon oxynitride.

The material layers 212, 214 may be deposited by chemical vapor deposition processes as described herein. Both material layers 212, 214, may be deposited in a continuous manner in the same processing chamber of processing system without breaking vacuum. The continuous manner may be achieved by changing the flow rates of the respective precursors during the deposition process. nitrogen-containing Additionally, layers may be deposited by alternative methods, such as physical vapor deposition (PVD). One exemplary substrate processing system and plasma enhanced chemical vapor deposition (PECVD) processing chamber available from Applied Materials, Inc., Santa Clara, Calif. are further described in FIGS. 8 and 9.

Figure 2B:
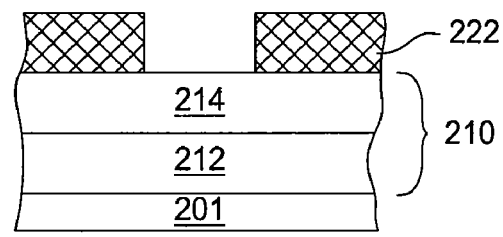

In FIG. 2B, a photoresist 222 can be deposited and developed to produce a desired pattern over the surface of the second material layer 214 during fabrication of a device structure.

Figure 2C:
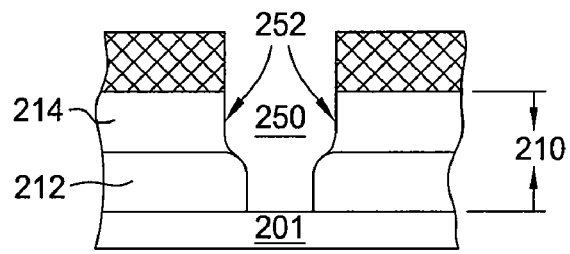

In FIG. 2C, a pattern etching process is performed on the substrate 201 to form one or more features 250, resulting in side walls 252 in material layers 212, 214 that have at least a portion having an angle less than 90 degrees with the substrate surface as shown as angle alpha ($\alpha$) in FIG. 2C. The resulting features 250 may taper from the second material layer 214 to a portion of the first material layer 212 or to the exposed surface of the substrate 201. An etch rate ratio of the second material layer 214 to the first material layer 212 between about 100:1 and about 1.05:1, such as between about 20:1 and about 10:1, may be use to generate the profile shown in FIG. 2C. The etch profile may also be described as a concave etch profile the material layers.

Etching of deposited dual material layers can be performed by a wet etching technique using a wet etch solution. For example, a hydrofluoride (HF) solution having 6:1 Buffer Oxide Etchant (BOE) and including 7% w/w hydrofluoric acid, 34% w/w ammonium fluoride, and 59% w/w water can be used as a wet etching solution. A wet etching test for measuring a wet etch rate of a layer or a material layer can be carried out at a substrate temperature of about 25° C. The wet etch rate can be an indication of layer density. Typically, the lower the wet etch rate, the denser the layer.

Alternatively, etching of deposited dual material layers may be performed by a dry etching process. An example of a dry etch process may be a etch plasma using gases selected from the group consisting of $CH_2F_2$ and $CHF_3$ for silicon nitride and may be an etch plasma using gases selected from the group consisting of $C_4F_8$ and $CHF_3$ may be used when the first mask stack 304 comprises silicon oxide. The substrate 201 can alternatively be placed inside an etch chamber to etch the dual material layer 210 containing the first material layer 212 and the second material layer 214 into one or more features 250. Exemplary etch chambers, such as Dielectric Etch Super e™, which are available from Applied Materials, Inc., Santa Clara, Calif.

Figure 2D:
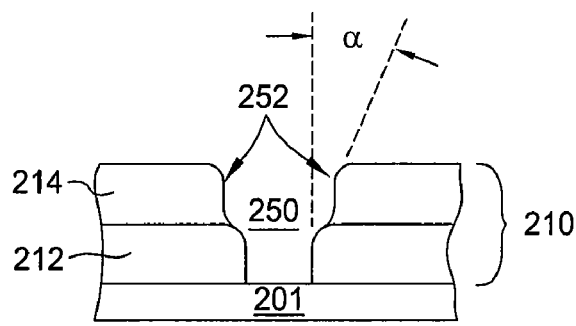

As shown in FIG. 2D, the photoresist 222 can be removed/stripped. The taper etch profiles defined by the side walls 252 of features 250 formed in the dual material layer 210 may form an etch angle alpha ($\alpha$) of more than zero degrees, such as between about 1 degree and about 80 degrees.

Figure 3A:
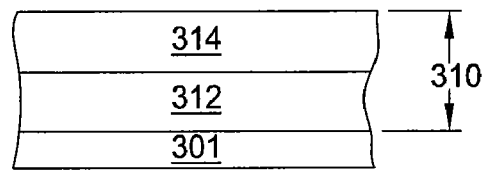
FIGS. 3A-3D are sectional views illustrating processing of a dual material layer with a taper etch profile in accordance with another embodiment of the invention.

FIGS. 3A-3D illustrate forming a dual material layer 310 with a taper etch profile in accordance with another embodiment of the invention. As shown in FIG. 3A, the dual material layer 310 containing a first material layer 312 and a second material layer 314 is sequentially deposited over the surface of the substrate 301. The first material layer 312 and the second material layer 314 are deposited such that differential etch rates for the first material layer 312 and the second material layer 314 can be obtained and the dual material layer 310 with a taper etch profile from the substrate surface 301 to a portion of the second material layer 314 or the top surface of the second material layer 314. For example, the etch rate of the first material layer 312 can be controlled to be greater than the etch rate of the second material layer 314 during the deposition of the first material layer 312 and the second material layer 314 by using different precursors and/or adjusting the amounts of precursors used in the deposition process. Both material layers 312, 314, may be deposited in a continuous manner in the same processing chamber of processing system without breaking vacuum. The continuous manner may be achieved by changing the flow rates of the respective precursors during the deposition process.

Figure 3B:
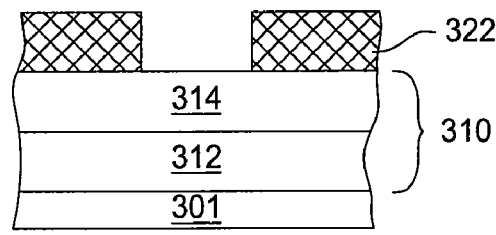

In FIG. 3B, a photoresist 322 can be deposited in accordance with a desired pattern over the surface of the dual material layer 310 during fabrication of a device structure.

Figure 3C:
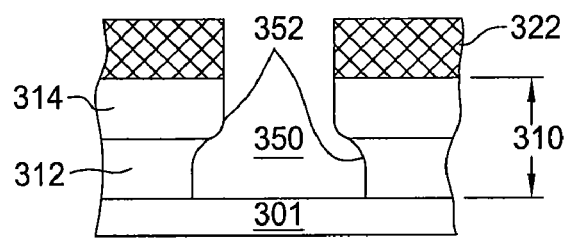

In FIG. 3C, pattern etch is performed on the substrate 301 to form one or more features 350 resulting in side walls 352 in material layers 312, 314 that have an angle less than 90 degrees, etch angle beta ($\beta$), with the substrate surface. An etch rate ratio of the second material layer 314 to the first material layer 312 between about 1:100 and about 1:1.05, such as between about 1:20 and about 1:10, may be use to generate the profile shown in FIG. 3C. The etch profile may also be described as a convex etch profile the material layers.

Figure 3D:
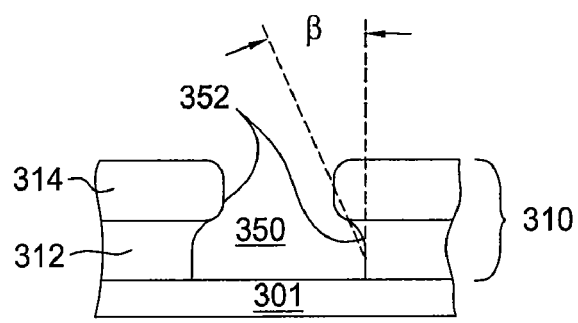

FIG. 3D illustrates removal of photoresist 322 to expose the underlying taper etch profiles obtained over the features 350 in the dual material layer 310. In one embodiment, the side walls 352 of the dual material layer 310 form into an etch angle beta ($\beta$) of more than zero degrees, such as between about 1 degree and about 80 degrees.

Figure 4:
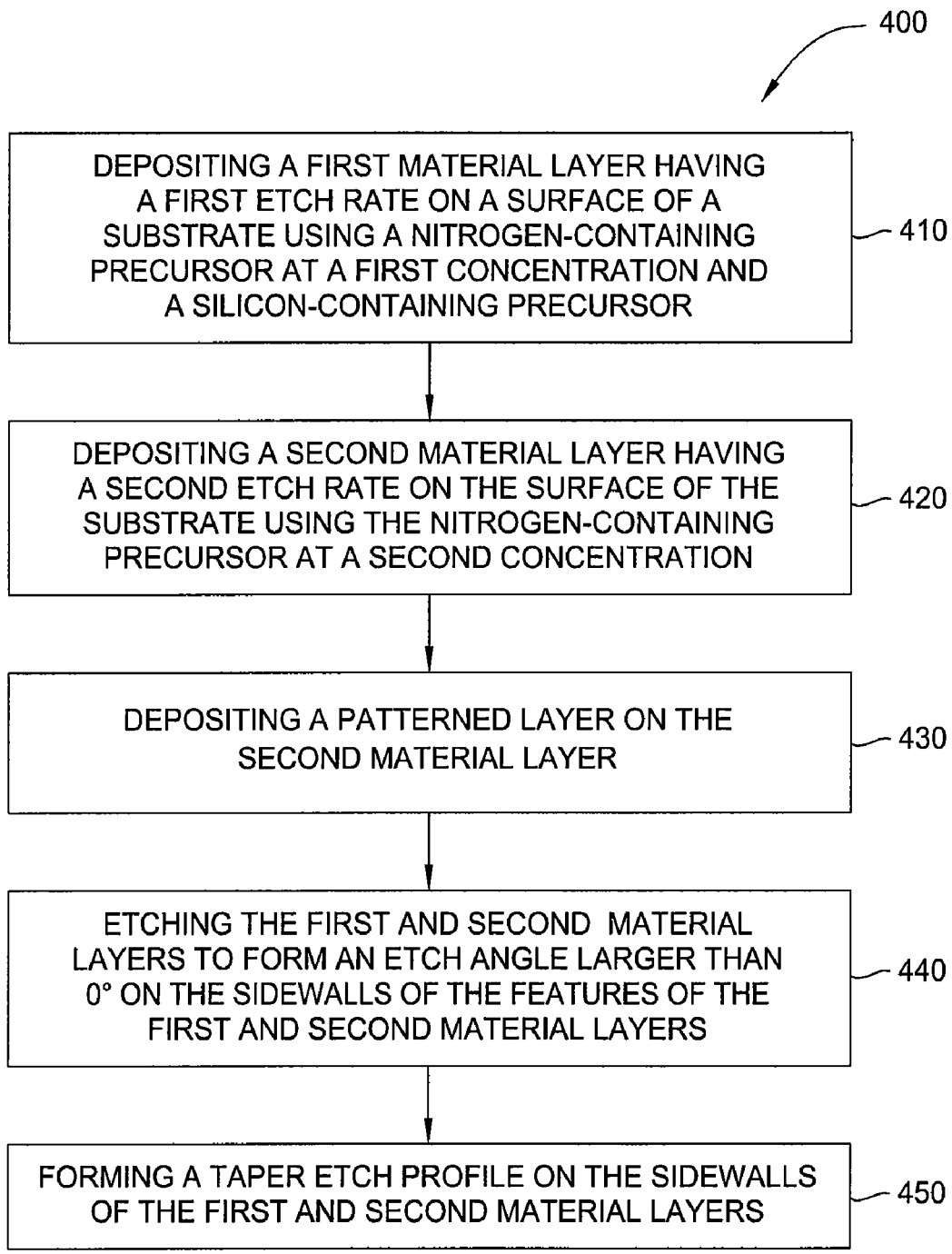
FIG. 4 is an exemplary process flow diagram of a method for processing a multi-layer layer stack having a dual material layer deposited thereon according to one embodiment of the invention.

One exemplary method for depositing the first material layer 212 (or 312) and the second material layer 214 (or 314) is described in FIG. 4.

FIG. 4 is an exemplary process flow diagram of a method 400 for processing a multi-layer layer stack having a dual material layer deposited thereon according to one embodiment of the invention.

At step 410, a first material layer having a first etch rate is deposited on the surface of the substrate in a first chemical vapor deposition processing chamber using a first composition of precursors. The first composition for depositing the first material layer with the first etch rate may include a nitrogen-containing precursor at a first amount and a silicon-containing precursor. The silicon-containing precursor may comprise silane ($SiH_4$) and silane derivatives. For depositing a silicon oxide layer inside a chemical vapor deposition processing chamber, the nitrogen-containing precursor may comprise nitrous oxide ($N_2O$). For depositing a silicon nitride layer, the nitrogen-containing precursor may comprise nitrogen gas ($N_2$), ammonia ($NH_3$), and combinations thereof. Other silicon-containing precursors, such as organosilicon compounds including trimethylsilane or phenylsilane, and nitrogen-containing precursors, such as hydrazine ($H_2N_2$), may also be used with the deposition processes described herein.

At step 420, a second material layer having a second etch rate different from the first etch rate is deposited on the surface of the substrate in a second chemical vapor deposition processing chamber using a second composition of precursors. The second composition of precursors may include the same nitrogen-containing precursor as used in the first composition of precursor but at a second amount different from the first amount. The different compositions of the processing gasses for the first material layer and the second material layer result in differential etch rates of the first material layer and the second material layer, and can be processed to produce features of desired shapes in the deposited material layers. For an etch structure tapering to the substrate surface, the second amount of nitrogen-containing precursor may be greater than the first amount of nitrogen-containing precursor for a silicon oxide layer or a silicon nitride layer. For an etch structure tapering from the substrate surface, the second amount of nitrogen-containing precursor is less than the first amount of nitrogen-containing precursor for a silicon-oxide layer or a silicon nitride layer.

The first and second material layer may be deposited continuously in the same processing chamber by changing the flow rates of the respective precursors from the first material layer deposition to the second material layer deposition while maintaining deposition conditions. For example, the first and second material layer may be deposited continuously in the same processing chamber by increasing or decreasing the flow rate of the nitrogen-containing precursor during the second material layer deposition while maintaining the silicon-containing precursor amount. Alternatively, the relative amounts of both the nitrogen-containing precursor and the silicon-containing precursor may be adjusted to deposit the first and second materials layers continuously in the same chamber under the same deposition conditions. In a further embodiment of the deposition processes, a silicon oxide and silicon nitride dual layer deposition processes may be performed in situ in a continuous deposition scheme by substituting the respective nitrogen-containing precursors between nitrous oxide and ammonia, depending on the layer deposition order. In a further embodiment of the deposition processes, the first and second material layer deposition processes may be performed in situ in a non-continuous two-step deposition scheme, such as a processing gas purge step between the deposition steps.

In situ should be broadly construed and includes, but is not limited to, in a given chamber, such as in a plasma chamber, or in a system, such as an integrated cluster tool arrangement, without exposing the material to intervening contamination environments, such as breaking vacuum between process steps or chambers within a tool. An in situ process typically minimizes process time and possible contaminants compared to relocating the substrate to other processing chambers or areas.

At step 430, a patterned layer is deposited on the dual material layer of the first material layer and the second material layer. The patterned layer may include patterned photoresist material, patterned hardmask materials, or combinations thereof. The patterned layer are typically deposited to define the widest portion of the etch structure to be formed when the etch structure tapers to the substrate surface and the patterned layer are typically deposited to define the narrowest portion of the etch structure to be formed when the etch structure tapers from the substrate surface.

At step 440, etching of the dual material layer is performed to form an etch angle larger than 0° from the etching edges or the side walls of the features of the first material layer and the second material layer.

At step 450, a taper etch profile is obtained after etching of the dual material layer as a result of the differential etch rates of the first material layer and the second material layer. As used herein the amount of a compound and the corresponding flow rates have a direct connection as increased flow rates result in increase amounts on the individual components in the processing gases and in the deposited materials.

It is believed that the amounts of the nitrogen-containing nitrous oxide ($N_2O$) precursor can be controlled such that different amounts of the nitrous oxide ($N_2O$) precursor can be used during deposition of the first and second silicon oxide layer to control the respective etch rates of the deposited silicon oxide layers, to minimize nitrous oxide ($N_2O$) precursor consumption, to help maximize throughput of the deposition process, and optimize the etch profile of the deposited layers. It has been observed that a lower nitrogen oxide flow rate results in a lower concentration of nitrous oxide in the processing gases, which results in a deposited silicon oxide material with a lower etch rate.

In one embodiment of the invention, a dual silicon oxide layer can be formed by depositing first and second silicon oxide layers sequentially from a composition of a silicon-containing precursor, such as silane ($SiH_4$), and a nitrogen-containing precursor. For silicon oxide deposition processes, the nitrogen-containing precursor may be a hydrogen free nitrogen-containing precursor or a nitrogen-containing precursor having one or more oxygen atoms, such as nitrous oxide ($N_2O$). It has been observed that the second amount of the nitrous oxide ($N_2O$) precursor for depositing the second silicon oxide layer can be adjusted to be greater than the first amount of the nitrous oxide ($N_2O$) precursor such that the second silicon oxide layer has a greater etch rate than the first silicon oxide layer. As a result, an etch profile similar to the etch profile of the feature 250 can be formed. The resulting dual silicon oxide layer is useful for fabricating structures found in many display devices that require a taper or concave feature profile. Accordingly, the second silicon oxide layer is deposited as an etch profile controlling layer.

Additionally, a dual silicon nitride layer can be formed by depositing first and second silicon oxide layers sequentially from a composition of silane ($SiH_4$), nitrogen gas ($N_2$), and ammonia ($NH_3$). It was observed that the second amount of the nitrogen-containing precursor, for example, ammonia ($NH_3$) for depositing the second silicon nitride layer can be adjusted to be greater than the first amount of the nitrogen-containing precursor ($NH_3$) such that the second silicon nitride layer has a greater etch rate than the first silicon nitride layer. Alternatively, it was observed that the second amount of the nitrogen-containing precursor ($N_2$) for depositing the second silicon nitride layer can be adjusted to be less than the first amount of the nitrogen-containing precursor ($N_2$) such that the second silicon nitride layer has a greater etch rate than the first silicon nitride layer. As a result, an etch profile similar to the etch profile of the feature 250 can be formed for the ammonia and nitrogen gas embodiments described above. The resulting dual silicon nitride layer is useful for fabricating structures found in many display devices that require a taper or concave feature profile. Accordingly, the second silicon nitride layer is deposited as an etch profile controlling layer.

In another example, a dual silicon oxide layer can be formed by depositing first and second silicon oxide layers sequentially from a composition of silane ($SiH_4$) and nitrous oxide ($N_2O$). It is observed that the amounts of the nitrogen-containing nitrous oxide ($N_2O$) precursor can be controlled such that lower amount of the nitrous oxide ($N_2O$) precursor can be used during deposition of the second silicon oxide layer to reduce the etch rate of the deposited silicon oxide layer, to minimize nitrous oxide ($N_2O$) precursor consumption, to help maximize throughput of the deposition process, and optimize the etch profile of the deposited layers. As a result, an etch profile similar to the etch profile of the feature 350 can be formed. In one embodiment, the second silicon oxide layer having a lower etch rate than the first silicon oxide layer exhibits high layer quality and can be used to fabricate structures found in many display devices that require a taper or convex etch profile in the features.

In a further example, a dual silicon nitride layer can be formed by depositing a first and a second silicon nitride layer sequentially. The silicon nitride layers may be deposited from a silicon-containing precursor and one or more nitrogen-containing precursors. The silicon-containing precursor may be the same as described for the silicon oxide deposition process, for example, silane ($SiH_4$), and the nitrogen-containing precursor may comprise one or more precursors selected from the group of nitrogen gas ($N_2$) and ammonia ($NH_3$). The precursors may be further detailed as nitrogen-containing precursors having one or more hydrogen atom, such as ammonia or hydrazine, and hydrogen-free nitrogen-containing precursor, such as nitrogen gas.

It was observed that the second amount of the nitrogen-containing precursor, for example, ammonia ($NH_3$) for depositing the second silicon nitride layer can be adjusted to be less than the first amount of the nitrogen-containing precursor ($NH_3$) such that the second silicon nitride layer has a lesser etch rate than the first silicon nitride layer. Alternatively, it was observed that the second amount of the nitrogen-containing precursor ($N_2$) for depositing the second silicon nitride layer can be adjusted to be greater than the first amount of the nitrogen-containing precursor ($N_2$) such that the second silicon nitride layer has a lesser etch rate than the first silicon nitride layer. As a result, an etch profile similar to the etch profile of the feature 350 can be formed. In one embodiment, the second silicon nitride layer having a lower etch rate than the first silicon nitride layer exhibits high layer quality and low refractive index and can be used to fabricate structures found in many display devices that require a low refractive indexed silicon nitride layer and/or a taper or convex etch profile in the features. Alternatively, the flow rates of one or both gases may be adjusted for tuning etch properties for a deposition process. For example, in a processing gas having both nitrogen-containing precursors, one nitrogen-containing precursor may increase or decrease in flow rate while the other nitrogen-containing precursor maintains the same flow rate. Alternatively, the flow rates of the respective gases may increase or decrease independently of each other, which may result in both precursors increasing or decreasing proportionally on non-proportionally or having one precursor increasing in flow rate while the other precursor has a decreasing flow rate.

In addition, it is found that hydrogen gas ($H_2$) can be included for depositing the first and/or the second silicon nitride layer to control the etch profile of the deposited silicon nitride layers. For example, a silicon nitride layer can be deposited from a composition of silane, ammonia, nitrogen gas, and hydrogen gas ($H_2$) to obtained differentiating etch rates as compared to a silicon nitride layer deposited from a composition of silane, ammonia, and nitrogen gas. It has been observed that the introduction of hydrogen gas in the silicon nitride processing gases allows for a reduced dry etch rate and/or wet etch rate compared to a material deposited from a silicon nitride processing gas not having hydrogen gas. Further, the addition of hydrogen gas ($H_2$) in the precursor composition helps to minimize ammonia ($NH_3$) precursor consumption and reduce the refractive index of the resulting silicon nitride layer. Additionally, it has been found that a gas mixture of nitrogen gas and hydrogen gas will result in a net decrease in the etching rate of the silicon nitride layer compared to a process only having a nitrogen gas.

It has been observed that the etch rate between two silicon nitride layers may adjusted by the inclusion of hydrogen gas in one of the layers. It has been observed that the etching rate of a second silicon nitride layer may be less than the etching rate of a first silicon nitride layer when the first layer is deposited by a first composition of silane ($SiH_4$), nitrogen gas ($N_2$), and ammonia ($NH_3$) and the second layer is deposited by a second composition including a composition of silane ($SiH_4$), nitrogen gas ($N_2$), ammonia ($NH_3$), and hydrogen gas. As a result, an etch profile similar to the etch profile of the feature 250 can be formed. Additionally, it was observed that an etching rate of a second layer may be decreased by adjusting a mixture of hydrogen gas and nitrogen gas by increasing hydrogen gas flow rate while decreasing nitrogen gas flow rate from a first processing composition hydrogen gas flow rate and nitrogen gas flow rate.

The use of hydrogen gas in silicon nitride deposition for adjusting etching rates of deposited silicon nitride materials is more fully described in co-pending U.S. patent application Ser. No. 10/897,775, filed on Jul. 23, 2004, which is incorporated herein to the extent not inconsistent with the claimed aspects and disclosure herein.

Additionally the invention contemplates that two or more layers may be deposited to form desired structures. For example, the first and third layers of a three layer stack may have the same etch rate to allow the formation of etching features in the shape of hour glasses or diamond patterns. Additionally, the invention contemplates continuous depositions with changing precursor flow rates to form graduated composition layering structures to form etch features with smooth transitions between material layers.

A dual silicon oxide layer may be obtained in one embodiment of the invention by depositing a first silicon oxide layer at low level of surface uniformity and deposition rate of greater than about 2,500 Å/min or greater, such as between about 3,000 Å/min and about 15,000 Å/min, for example, a deposition rate of about 11,000 Å/min inside a PECVD chamber available from AKT, a division of Applied Materials, Inc., Santa Clara, Calif. A composition of precursors for the first silicon oxide layer may include silane ($SiH_4$) at a flow rate of greater than about 2,000 sccm, such as between about 3,500 sccm and about 5,500 sccm, for example, about 4,500 sccm, and nitrous oxide ($N_2O$) at a flow rate of greater than about 20,000 sccm or greater, such as between about 35,000 sccm and about 55,000 sccm, for example, about 45,000 sccm. The ratio of silicon-containing precursor to nitrogen-containing precursor is between about 2:7 and about 1:18, such as between 1:6 and 1:16, for example, about 1:10.

The spacing between the substrate and the gas distribution plate assembly may be between about 100 mils and about 900 mils, such as between about 400 mils and about 500 mils. The RF power for generating plasma may be about 5,000 W or greater, such as between about 8,500 W and about 10,000 W, for example, about 9,000 W, for a substrate size of about 1100×1300 $mm^2$. The pressure inside the PECVD chamber may be kept at a pressure between about 1 Torr or greater, such as between about 1 Torr and about 10 Torr, for example about 2 Torr (about 2000 mTorr). The deposition temperature for the first silicon oxide layer may be between about 300° C. and about 450° C., such as between about 340° C. and about 360° C. The first silicon oxide layer resulted in a wet etch rate (6:1 BOE) of greater than about 2,000 Å/min between about 2,050 Å/min and about 3,500 Å/min.

The dual silicon oxide layer also includes a second silicon oxide layer deposited at a lower deposition rate with a more uniform surface. The deposition rate of the second silicon oxide layer was about 2,500 Å/min or lower, such as between about 1,000 Å/min and about 2,500 Å/min, for example, a deposition rate of about 2,300 Å/min inside a PECVD chamber. A composition of precursors for the second silicon oxide layer may include silane (SiH$_4$) at a flow rate of about 2,000 sccm or lower, such as about 1,500 sccm or lower, such as between about 200 sccm and about 1,000 sccm, and nitrous oxide (N$_2$O) at a amount lower than the amount for depositing the first silicon oxide layer, such as at a flow rate of about 20,000 sccm or lower, such as, between about 2000 sccm and about 19,000 sccm, for example, between about 15,000 sccm and about 18,000 sccm. The ratio of silicon-containing precursor flow rate to nitrogen-containing precursor flow rate is between about 1:1 and about 1:100, such as between 1:5 and 1:50, for example, about 1:20.

The spacing between the substrate and the gas distribution plate assembly for depositing the second silicon oxide layer may be between about 100 mils and about 900 mils, such as between about 400 mils and about 700 mils. The RF power for generating plasma may be about 5,000 W or lower, such as between about 3,000 W and about 4,500 W, for example, about 4,200 W for a substrate size of about 1100×1300 mm$^2$. The pressure inside the PECVD chamber may be kept at a pressure of about 1 Torr or lower, such as between about 500 mTorr and about 800 mTorr. The deposition temperature for the second silicon oxide layer may be between about 300° C. and about 450° C. or between about 340° C. and about 360° C. The second silicon oxide layer resulted in a wet etch rate (6:1 BOE) of about 2,000 Å/min or lower, such as between about 1,000 Å/min and about 2,000 Å/min.

In one example of the deposition of the first silicon oxide material has a greater etch rate than the second silicon oxide layer, the silicon oxide layer was deposited with a silane flow rate of about 4500 sccm, a nitrous oxide (N$_2$O) flow rate of about 45,000 sccm, an applied RF power of about 9000 W, a pressure of about 2000 mTorr, a spacing of about 500 mil, and a temperature between about 340° C. and about 360° C. to produce a deposition rate of about 10800 Å/min, and an uniformity of about +/−10.7% at 12 mm edge exclusion. The first silicon oxide layer exhibited a wet etch rate of about 2,900 Å/min (6:1 BOE) and a low level of surface uniformity of about +/−10.7% at 12 mm edge exclusion.

In one example of the second silicon oxide layer, the silicon oxide layer was deposited with a silane flow rate of about 770 sccm, a nitrous oxide (N$_2$O) flow rate of about 16,500 sccm, an applied RF power of about 4200 W, a pressure of about 600 mTorr, a spacing of about 600 mil, and a temperature between about 340° C. and about 360° C. to produce a deposition rate of about 2300 Å/min, and an uniformity of about +/−5.5% at 12 mm edge exclusion. The example second silicon oxide layer exhibited a wet etch rate of about 1,900 Å/min (6:1 BOE) and a surface uniformity of about +/−5.5% at 12 mm edge exclusion.

The increased etching rate of the first silicon oxide material to the etching rate of the second silicon oxide material allows the formation of a tapered profile as shown in FIGS. 3A-3D. Reversing the deposition order of the two silicon oxide layers described herein allows the formation of a tapered profile as shown in FIGS. 2A-2D. The silicon oxide materials deposited in the order in the above examples under such processing conditions provides an etch rate selectivity for first silicon oxide layer to second silicon oxide layer may be between about 1.05:1 and 3:1, for example, about 3:2, using the processes described herein. Additionally, revering the deposition order would result in reversing the respective etch ratio.

A dual silicon nitride layer may be obtained in one embodiment of the invention by depositing a first silicon nitride layer at high level of surface uniformity and low etch rate inside a PECVD chamber available from AKT, a division of Applied Materials, Inc., Santa Clara, Calif. The dual silicon oxide layer also included a second silicon nitride layer deposited at low etch rate and into a less uniform surface.

The first silicon nitride layer and the second silicon nitride layer may include a deposition rate of about 1,000 Å/min or greater and such as between about 1,200 Å/min and about 2,000 Å/min, for example, a deposition rate of about 1,500 Å/min for the first silicon nitride layer and a deposition rate of about 1,300 Å/min for the second silicon nitride layer.

A composition of precursors for the first silicon nitride layer may include silane (SiH$_4$) at a flow rate of about 1,000 sccm or greater, such as between about 1,200 sccm and about 10,000 sccm, for example, between about 1,200 sccm and about 1,500 sccm, ammonia (NH$_3$) at a flow rate of about 5,000 sccm or greater, between about 5,000 sccm and about 15,000 sccm (or 10,000 sccm) such as between about 7,000 sccm and about 9,000 sccm, and an amount of nitrogen gas (N$_2$) at a flow rate of about 12,000 sccm or lower, such as between about 6,000 sccm and about 12,000, for example between about 9,000 sccm and about 11,000 sccm. In addition to the nitrogen gas (N$_2$) amount, the composition of precursors for the first silicon nitride layer may also include hydrogen gas (H$_2$) at a flow rate of about 5,000 sccm or greater, such as between about 8,000 sccm and about 15,000 sccm. The ratio of silicon-containing precursor flow rate to total nitrogen-containing precursor flow rate is between about 1:1 and about 1:27, for example, about 1:12. The ratio of silicon-containing precursor flow rate to individual nitrogen-containing precursor flow rate is between about 1:2 and about 1:12, for example, such as between about 1:2 and about 1:15, for example, between about 1:5 and about 1:7. The first silicon nitride layer resulted in a wet etch rate (6:1 BOE) of less than about 300 Å/min, such as between about 200 Å/min and about 250 Å/min.

The spacing between the substrate and the gas distribution plate assembly for the dual silicon nitride layer may be between about 100 mils and about 900 mils, such as between about 400 mils and about 500 mils. The RF power for generating plasma may be about 3,000 W or greater, such as between about 4,500 W and about 5,000 W for a substrate size of about 1100×1300 mm$^2$. The pressure inside the PECVD chamber may be kept at a pressure level of about 1 Torr or lower, such as between about 1,200 mTorr and about 1,600 mTorr. The deposition temperature for the dual silicon nitride layer may be about 300° C. or greater or between about 340° C. and about 360° C.

A composition of precursors for the second silicon nitride layer may include silane (SiH$_4$), ammonia (NH$_3$), and a greater amount of nitrogen gas (N$_2$) at a flow rate of about 10,000 sccm or greater, such as between about 12,000 sccm and about 16,000 sccm. The precursor composition may include silane (SiH$_4$) at a flow rate less than about 1,000 sccm, such as between about 500 sccm and about 950 sccm, ammonia (NH$_3$) at a flow rate of about 5,000 sccm or greater, between about 5,000 sccm and about 15,000 sccm (or 10,000 sccm), such as between about 7,000 sccm and about 9,000 sccm, and an amount of nitrogen gas (N$_2$) at a flow rate of greater than about 12,000 sccm, such as between about 12,000 sccm and about 20,500 sccm, for example, between about 13,000 sccm and about 15,000 sccm. The ratio of silicon-containing precursor flow rate to total nitrogen-containing precursor flow rate is between about 1:17 and about 1:80, for example, about 1:23. The ratio of silicon-containing precursor flow rate to individual nitrogen-containing precursor flow rate is between about 1:5 and about 1:50, such as between about 1:12 and about 1:30, for example, between about 1:8 and about 1:16

In addition, the composition of precursors for the second silicon nitride layer may also include no or a reduced amount of hydrogen gas ($H_2$) as compared to the composition for depositing the first silicon nitride layer, for example, no flow rate or a flow rate of less than about 5,000, such as between 100 sccm and 5,000 sccm. The second silicon nitride layer resulted in a wet etch rate (6:1 BOE) of about 300 Å/min or greater, such as between about 350 Å/min and about 800 Å/min.

The spacing between the substrate and the gas distribution plate assembly for the dual silicon nitride layer may be between about 100 mils and about 900 mils, such as between about 400 mils and about 500 mils. The RF power for generating plasma may be about 3,000 W or greater, such as between about 4,500 W and about 5,000 W for a substrate size of about 1100×1300 $mm^2$. The pressure inside the PECVD chamber may be kept at a pressure level of about 1 Torr or lower, such as between about 1,200 mTorr and about 1,600 mTorr. The deposition temperature for the dual silicon nitride layer may be about 300° C. or greater or between about 340° C. and about 360° C.

In one example of the deposition of the first silicon nitride material layer having a lower etch rate than the second silicon nitride layer, the silicon nitride layer was deposited with a silane flow rate of about 1500 sccm, an ammonia ($NH_3$) flow rate of about 7730 sccm, a nitrogen ($N_2$) flow rate of about 10000 sccm, an hydrogen ($H_2$) flow rate of about 10000 sccm, an applied RF power of about 4800 W, a pressure of about 1600 mTorr, a spacing of about 600 mil, and a temperature between about 340° C. and about 360° C. to produce a deposition rate of about 1500 Å/min, and an uniformity of about +/−5.1% at 12 mm edge exclusion. The example of the first silicon nitride layer exhibited a wet etch rate of about 220 Å/min (6:1 BOE) and surface uniformity of about +/−5.1% at 12 mm edge exclusion.

In one example of the second silicon nitride material layer, the silicon nitride layer was deposited with a silane flow rate of about 950 sccm, an ammonia ($NH_3$) flow rate of about 7730 sccm, a nitrogen ($N_2$) flow rate of about 14430 sccm, an applied RF power of about 4800 W, a pressure of about 1350 mTorr, a spacing of about 600 mil, and a temperature between about 340° C. and about 360° C. to produce a deposition rate of about 1300 Å/min, and an uniformity of about +/−7.9% at 12 mm edge exclusion. The example of the second silicon nitride layer exhibited a wet etch rate of about 550 Å/min (6:1 BOE) and surface uniformity of about +/−7.9% at 12 mm edge exclusion.

The increased etching rate of the first silicon nitride material to the etching rate of the second silicon nitride material allows the formation of a tapered profile as shown in FIGS. 2A-2D. Reversing the deposition order of the two silicon oxide layers described herein allows the formation of a tapered profile as shown in FIGS. 3A-3D. The silicon oxide materials deposited in the order in the above examples under such processing conditions provides an etch rate selectivity for first silicon oxide layer to second silicon oxide layer may be between about 1:1.4 and 1:4, for example, about 2:5, using the processes described herein. Additionally, revering the deposition order would result in reversing the respective etch ratio.

The first and second silicon-containing material layers in the above mentioned example 1 and example 2 can also be employed in combination to deposit a dual material layer with differential etch rate control, resulting in a high etch rate silicon oxide layer and a low etch rate silicon nitride layer. For example, an etch rate selectivity for silicon oxide versus silicon nitride can be controlled to be between about 5:4 and about 20:1, such as between about 10:1 and about 17:1, using the method and apparatus as described herein. A taper etch profile for the dual material layer containing the silicon oxide layer and the silicon nitride layer was obtained.

Alternatively, the silicon-containing precursor may also be adjusted control etching rates of the deposited material. It has been observed that increasing the silicon-containing precursor flow rates or amounts generally results in decreasing etch rates of the deposition silicon oxide or silicon nitride material.

For flat panel display application, the substrate may comprise a material that is essentially optically transparent in the visible spectrum, for example glass or clear plastic. The substrate may be of varying shapes or dimensions. For example, for thin layer transistors applications, the substrate may be a large area glass substrate having a high degree of optical transparency with a surface area greater than about 500 $mm^2$. However, the invention is equally applicable to substrate processing of any types and sizes. Substrates of the invention can be circular, square, rectangular, or polygonal for semiconductor wafer manufacturing and flat panel display manufacturing.

The surface area of a rectangular substrate for flat panel display is typically large, for example, a rectangle of about 500 $mm^2$ or larger, such as at least about 300 mm by about 400 mm, for example, about 120,000 $mm^2$ or larger. In addition, embodiments of the invention apply to substrate for fabricating various devices, such as Surface-conduction Electron-emitter Display (SED), Liquid Crystal Display (LCD), Plasma Display Panels (PDP), Field Emission Display (FED), Organic Light Emitting Diode (OLED), flexible organic light emitting diode (FOLED) display, polymer light emitting diode (PLED) display, organic thin layer transistor, active matrix, passive matrix, top emission device, bottom emission device, solar cell, solar panel, and other flat panel display (FPD) technologies. The substrate can be any of the silicon wafers, glass substrates, metal substrates, plastic layers (for example, polyethylene terephthalate (PET), polyethylene naphthalate (PEN), etc.), and plastic epoxy layers, among others.

Figure 5:
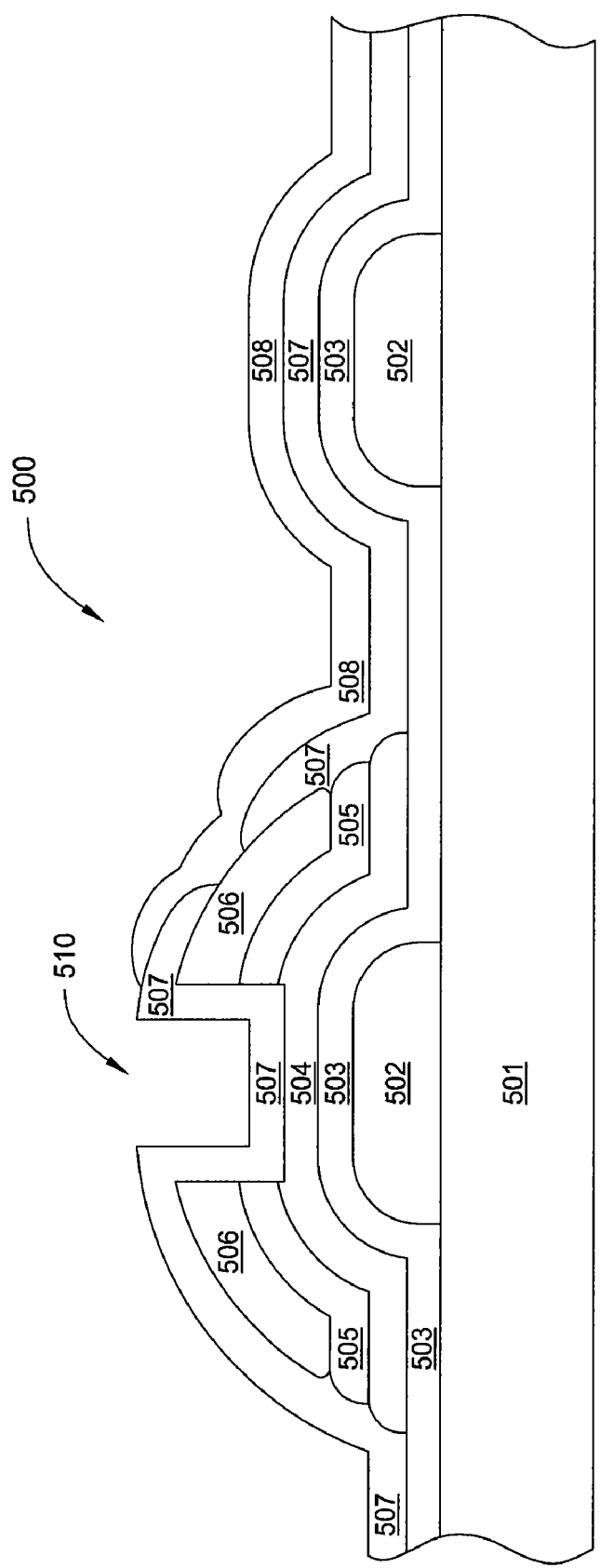
FIG. 5 illustrates one example of a multi-layer layer stack having a dual material layer deposited thereon useful for fabricating a bottom gate thin layer transistor structure according to one embodiment of the invention.

FIG. 5 depicts an exemplary bottom gate structure of a thin layer transistor 500 having a back aperture etch (BCE) inverted staggered structure formed on a substrate 501. The structure of the thin layer transistor 500 includes a multi-layer layer stack having a dual material layer as described herein deposited thereon. A gate electrode layer 502 is deposited and patterned on the surface of the substrate 501. The gate electrode layer 502 may include an electrically conductive material, such as a metal material, for example, aluminum (Al), molybdenum (Mo), neodymium (Nd), aluminum neodymium (AlNd), tungsten (W), chromium (Cr), tantalum (Ta), titanium (Ti), copper (Cu), aluminum nitride ($Al_xN_y$), molybdenum nitride ($Mo_xN_y$), tantalum nitride (TaN), titanium nitride (TiN), other metal nitrides, their alloys, and combinations thereof, among others, to control the movement of charge carriers within the thin layer transistor. The gate electrode layer 502 may be formed using conventional deposition, lithography, and etching techniques.

Between the substrate 501 and the gate electrode layer 502, there may be an optional layer of an insulating material, such as silicon dioxide ($SiO_2$), silicon nitride (SiN), which can be formed using a plasma enhanced chemical vapor deposition (PECVD) system of the kind which will be described herein and methods as described herein. The layer stack further includes one or more silicon-containing layers, for example, a gate insulation layer 503 and a semiconductive layer formed over the gate electrode layer 502. In addition, a bulk semiconductor layer 504 and a doped semiconductor layer 505 are formed on the gate insulation layer 503.

The doped semiconductor layer 505 directly contacts portions of the bulk semiconductor layer 504, forming a semiconductor junction. The gate insulation layer 503 may include a dielectric material, such as silicon nitride (SiN), silicon oxynitride (SiON), silicon dioxide (SiO$_2$), etc. The gate insulation layer 503, which also serves as storage capacitor dielectric, may be formed to a thickness in the range of about 100 Å to about 6000 Å. One example of the gate insulation layer 503 is a silicon nitride layer deposited by a method and a chemical vapor deposition (CVD) substrate processing system described herein.

The bulk semiconductor layer 504 may comprise amorphous silicon (α-Si), polycrystalline silicon (polysilicon), silicon dioxide (SiO$_2$), and other silicon materials. The bulk semiconductor layer 504 may be deposited to a thickness in the range of about 100 Å to about 3000 Å. The doped semiconductor layer 505 formed on top of the semiconductor layer 504 may comprise n-type (n+) amorphous silicon (α-Si), doped p-type (p+) doped amorphous silicon (α-Si), n+ doped polycrystalline (polysilicon), p+ polycrystalline (polysilicon). The doped semiconductor layer 505 may be deposited to a thickness within a range of about 100 Å to about 3000 Å.

The bulk semiconductor layer 504 and the doped semiconductor layer 505 are lithographically patterned and etched using conventional techniques to define a mesa of these two layers over the gate insulation layer 503 before a conductive layer 506 is deposited on the exposed surface of these silicon-containing semiconductor layers. The conductive layer 506 may comprise a metal material, for example, aluminum (Al), molybdenum (Mo), neodymium (Nd), aluminum neodymium (AlNd), tungsten (W), chromium (Cr), tantalum (Ta), titanium (Ti), copper (Cu), aluminum nitride (Al$_x$N$_y$), molybdenum nitride (Mo$_x$N$_y$), tantalum nitride (TaN), titanium nitride (TiN), other metal nitrides, and alloys. The conductive layer 506 may be deposited to a thickness within a range of about 100 Å to about 6000 Å. The conductive layer 506 and one or more underlying semiconductor layers, for example, the bulk semiconductor layer 504 and the doped semiconductor layer 505, may be lithographically patterned to define source and drain contacts of the TFT.

A passivation layer 507 may be deposited to conformably coats exposed surfaces of the layer stack and over the aperture 510 and the source and drain contacts of the TFT. The passivation layer 507 is generally an insulator and may comprise one ore more dielectric materials, for example, silicon dioxide (SiO$_2$), silicon nitride (SiN), among others. The passivation layer 507 may be deposited to a thickness of about 100 Å or larger, such as in the range of about 1000 Å to about 5000 Å. The passivation layer 507 may be formed as a dual material layer using a method and a plasma enhanced chemical vapor deposition (PECVD) substrate processing system described herein. The passivation layer 507 is then lithographically patterned and etched, wet etch or dry etch, to open contact apertures 510 in the passivation layer 507.

A transparent conductor layer 508 is then deposited and patterned to make contacts with the conductive layer 506. The transparent conductor layer 508 comprises a material that is essentially optically transparent in the visible spectrum and is electrically conductive. The transparent conductor layer 508 may comprise, for example, indium tin oxide (ITO) or zinc oxide, among others. Patterning of the transparent conductive layer 508 is accomplished by conventional lithographical and etching techniques.

Figure 6:
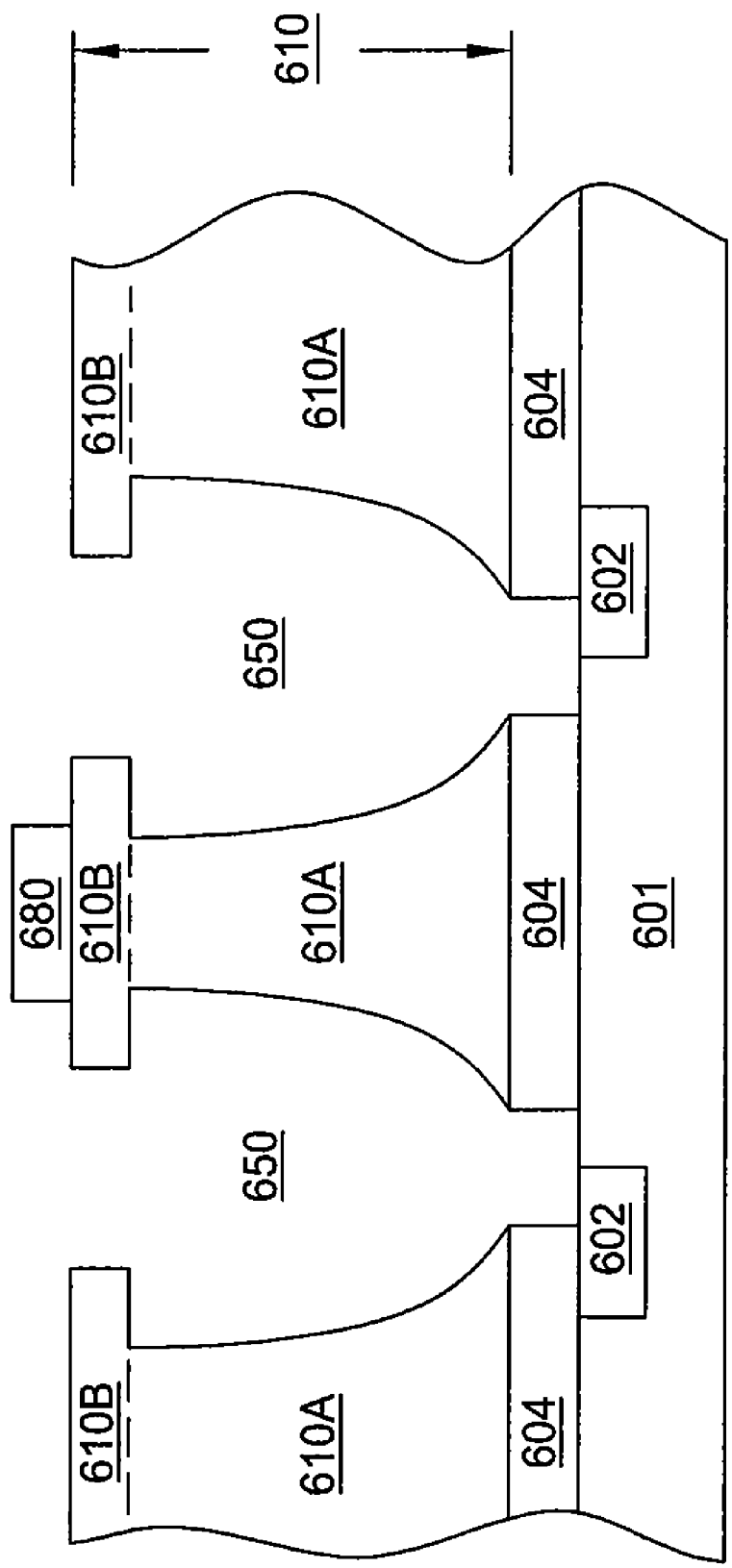
FIG. 6 illustrates one example of a multi-layer layer stack having a dual material layer deposited thereon useful for fabricating a surface-conduction electron-emitter display (SED) device according to one embodiment of the invention.

FIG. 6 illustrates another example of a multi-layer layer stack having a dual material layer deposited thereon useful for fabricating a surface-conduction electron-emitter display (SED) device. In general, one or more electrodes 602, such as copper electrodes, are formed on the surface of a substrate 601. A passivation layer 604 with low etch rate, such as a low etch rate silicon nitride layer deposited over the surface of the substrate 601 followed by deposition of a bulk insulation layer 610 using, for example, the method 400. One example of the bulk insulation layer 610 is a silicon oxide layer, such as a low dielectric constant silicon oxide layer. In one embodiment, the etch rate of the bulk insulation layer 610 is controlled to be lower than the passivation layer 604, such that after feature patterning and etching, concave etch profiles are generated at the bottom of one or more features 650 in the dual layer of the passivation layer 604 and the bulk insulation layer 610.

In another embodiment, the bulk insulation layer 610 is deposited as a dual material layer containing a first silicon oxide layer 610A, and a second silicon oxide layer 610B using, for example, the method 400 and substrate processing systems described herein. The first silicon oxide layer 610A may be deposited as one or more layers by method 400 to achieve the desired etch profile. The second silicon oxide layer 610B is deposited using a composition of precursors containing a lower amount of a nitrogen-containing precursor, for example, a nitrous oxide precursor, such that the etch rate of the second silicon oxide layer 610B is lower than the first silicon oxide layer 610A. As a result, a taper etch profile in the bulk insulation layer 610 can be obtained. As shown in FIG. 6, convex etch profiles are generated near the upper portion of the features 650 in the bulk insulation layer 610.

Figure 7:
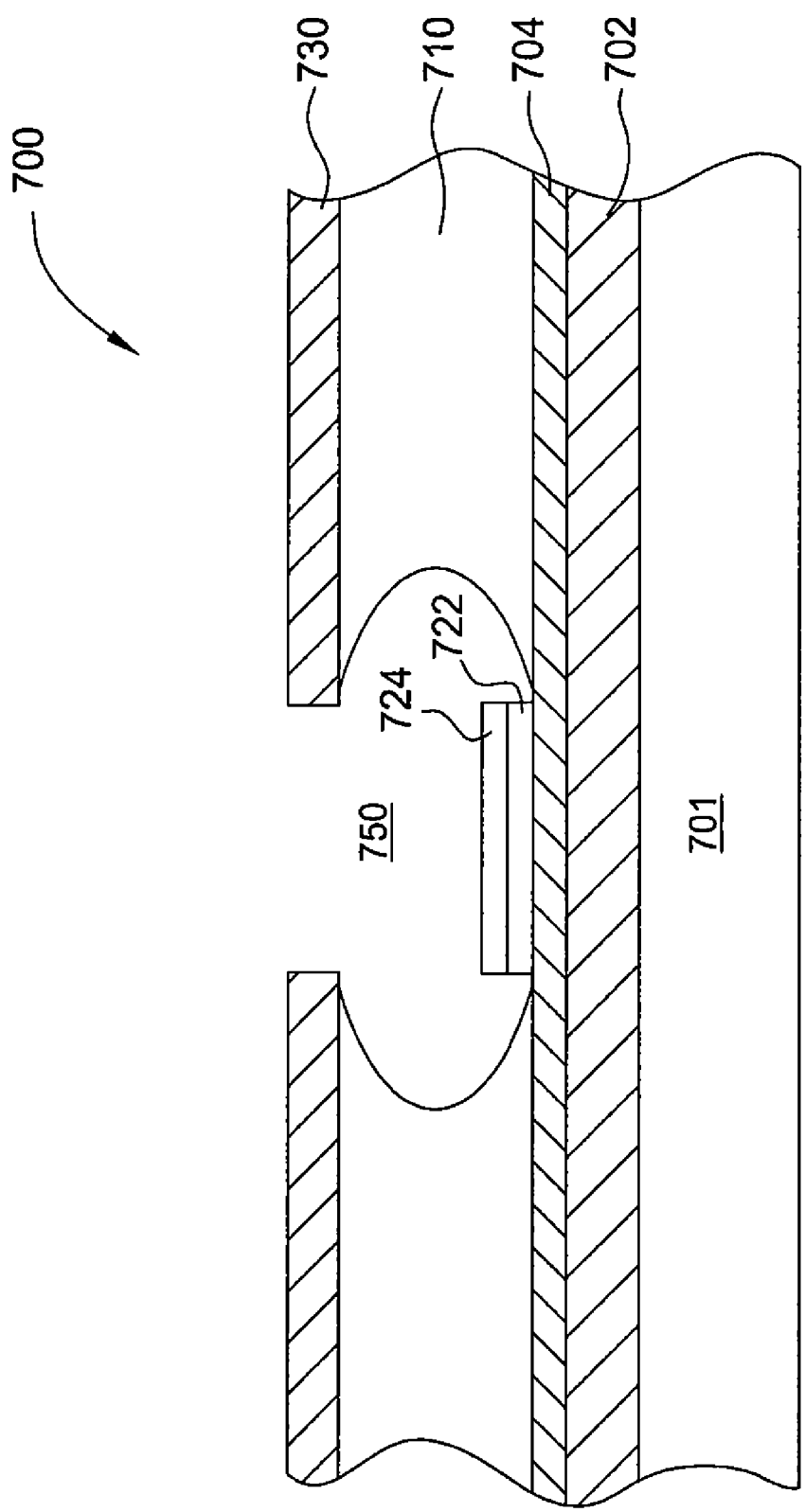
FIG. 7 illustrates one example of a multi-layer layer stack having a dual material layer deposited thereon useful for fabricating a field emission display (FED) device according to one embodiment of the invention.

FIG. 7 illustrates one example of a multi-layer layer stack having a dual material layer deposited thereon useful for fabricating a feature 750, for example, a gate aperture, for a field emission display (FED) device 700 according to one embodiment of the invention. The diameter of the feature 750 is not limited, for example, a gate aperture in a diameter of about 5 micron or larger, such as about 7 micron or larger.

In general, a first bulk conductive layer 702, such as a molybdenum layer, is deposited over the surface of a substrate 701. The thickness of the first bulk conductive layer 702 is about 100 nm or larger, such as about 150 nm or larger. A semiconductor layer 704, such as an amorphous silicon (α-Si) layer, is formed over the surface of the conductive layer 702. The thickness of the semiconductor layer 704 is about 100 nm or larger, such as about 200 nm or larger.

In one embodiment, an insulator layer 710, such as a silicon oxide layer, is formed into a dual material layer over the surface of the semiconductor layer 704 using the method and apparatus described herein. The bulk insulation layer 710 is deposited as one or more dual material layers containing one or more silicon oxide layers using, for example, the method 400 and substrate processing systems described herein. A second bulk conductive layer 730, such as a molybdenum layer, is also deposited prior to pattern etching using a photoresist for forming the feature 750. The thickness of the second bulk conducive layer 730 is about 100 nm or larger, such as about 300 nm or larger.

A second pattern etch is also performed on the insulator layer 710 such that one or more features 750 are formed and taper etch profiles over the side walls of the features 750 in the insulator layer 710 and/or the second bulk conductive layer 730 are obtained. As shown in FIG. 7, convex etch profiles are generated near the upper portion of the features 750 in the bulk insulation layer 710 and concave etch profiles are generated near the lower portion of the features 750 in the bulk insulation layer 710.

One or more electron emitters having a first emitter layer 722 and a second emitter layer 724 are deposited into the features 750, for example, gate apertures, and formed over the surface of the substrate 701. The first emitter layer 722 may include a metal material, such as chromium, etc., in a diameter of about 3 micron or larger within the feature 750. The thickness of the first emitter layer 722 may be about 5 nm or lager, such as about 10 nm or larger. The second emitter layer 724 may include a metal material, such as nickel, nickel alloys, iron, iron alloys, cobalt, cobalt alloys, iron nickel cobalt alloy, their alloy combinations, etc., in a diameter of about 3 micron or larger, such as between about 8 micron and about 10 micron within the feature 750. The thickness of the second emitter layer 724 may be about 5 nm or lager, such as about 10 nm or larger. Once the electron emitter layers are deposited, any photoresist materials or unnecessary electron emitter materials are removed.

In one embodiment, a substrate processing system having a chemical vapor deposition processing chamber is provided to deposit a dual material layer and controlling the etch profile of the dual material layer. The substrate processing system is adapted to deposit a first material layer having a first etch rate in a first chemical vapor deposition processing chamber using a first composition of precursors comprising a nitrogen-containing precursor at a first amount and a silicon-containing precursor and to deposit a second material layer having a second etch rate lower than the first etch rate in a second chemical vapor deposition processing chamber using a second composition of precursors comprising the nitrogen-containing precursor at a second amount lower than the first amount such that the dual material layer having the first material layer and the second material layer is formed on the surface of a substrate. The substrate processing system further includes an etch chamber and/or a wet etch station to etch the dual material layer to form an etch angle larger than 0° from the side walls of the features of the first material layer and the second material layer and to form a taper etch profile in the dual material layer.

Figure 8:
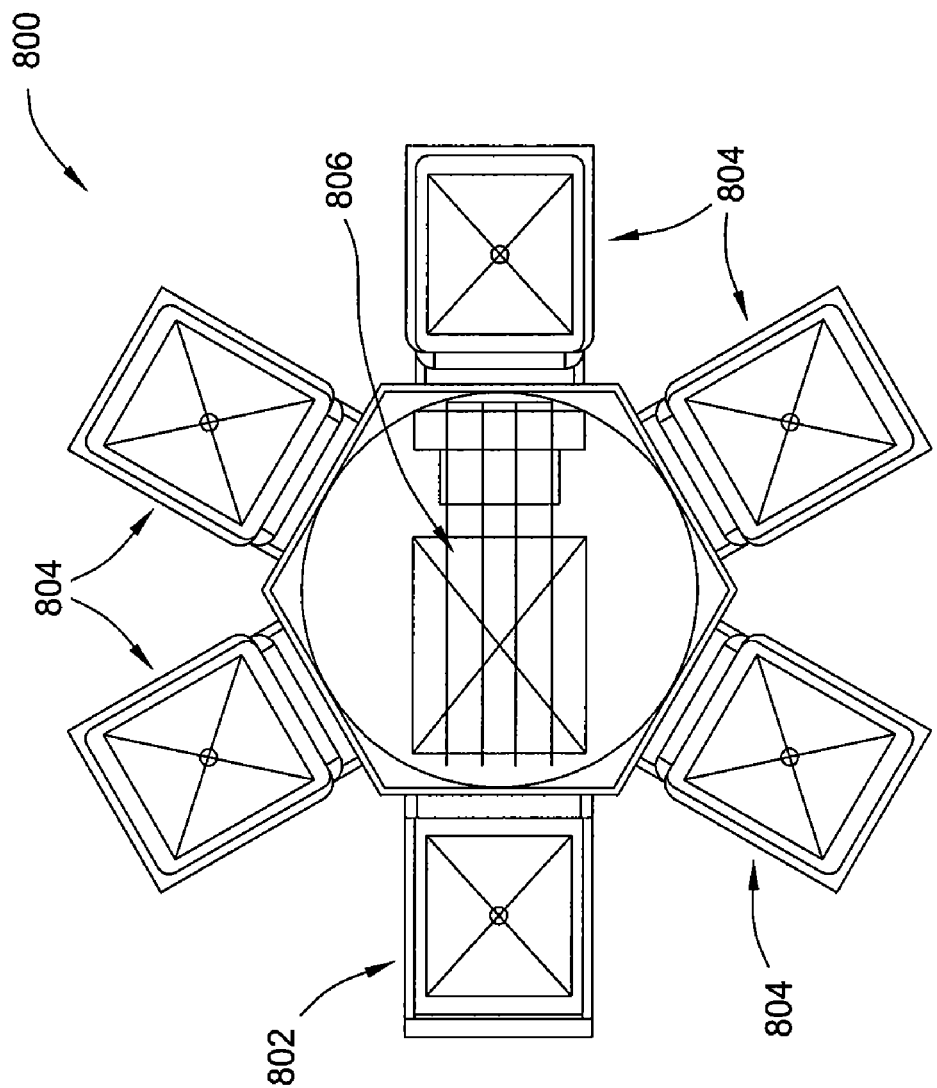
FIG. 8 illustrates a schematic view of a multi-chamber processing system according to one embodiment of the invention

FIG. 8 shows a cluster type of a substrate processing system 800 that can be used to form a dual material layer as described herein. One example of a substrate processing system for processing large area substrates is available from AKT, a division of Applied Materials, Inc., Santa Clara, Calif. The substrate processing system 800 may include at least one load lock chamber 802, at least one processing chamber 804, at least one transfer chamber 806, and optionally at least one buffer chamber to be connected to other cluster substrate processing system. One or more processing chambers 804 are attached to the transfer chamber 806. The processing chambers 804 may be, for example, physical vapor deposition processing chambers, ion implant processing chambers, etch processing chambers, chemical vapor deposition processing chambers, wet etch stations, and any other system in which deposition and controlling the etch profile of a dual material layer are desired.

In one embodiment, the first material layer and the second material layer can be sequentially deposited in the same deposition processing chamber. Alternatively, the dual material layer having the first material layer and the second material layer can be sequentially deposited in different processing chambers. In another embodiment, the first material layer and the second material layer comprises the same silicon-containing material. In another embodiment, the first material layer and the second material layer comprises different silicon-containing material.

Figure 9:
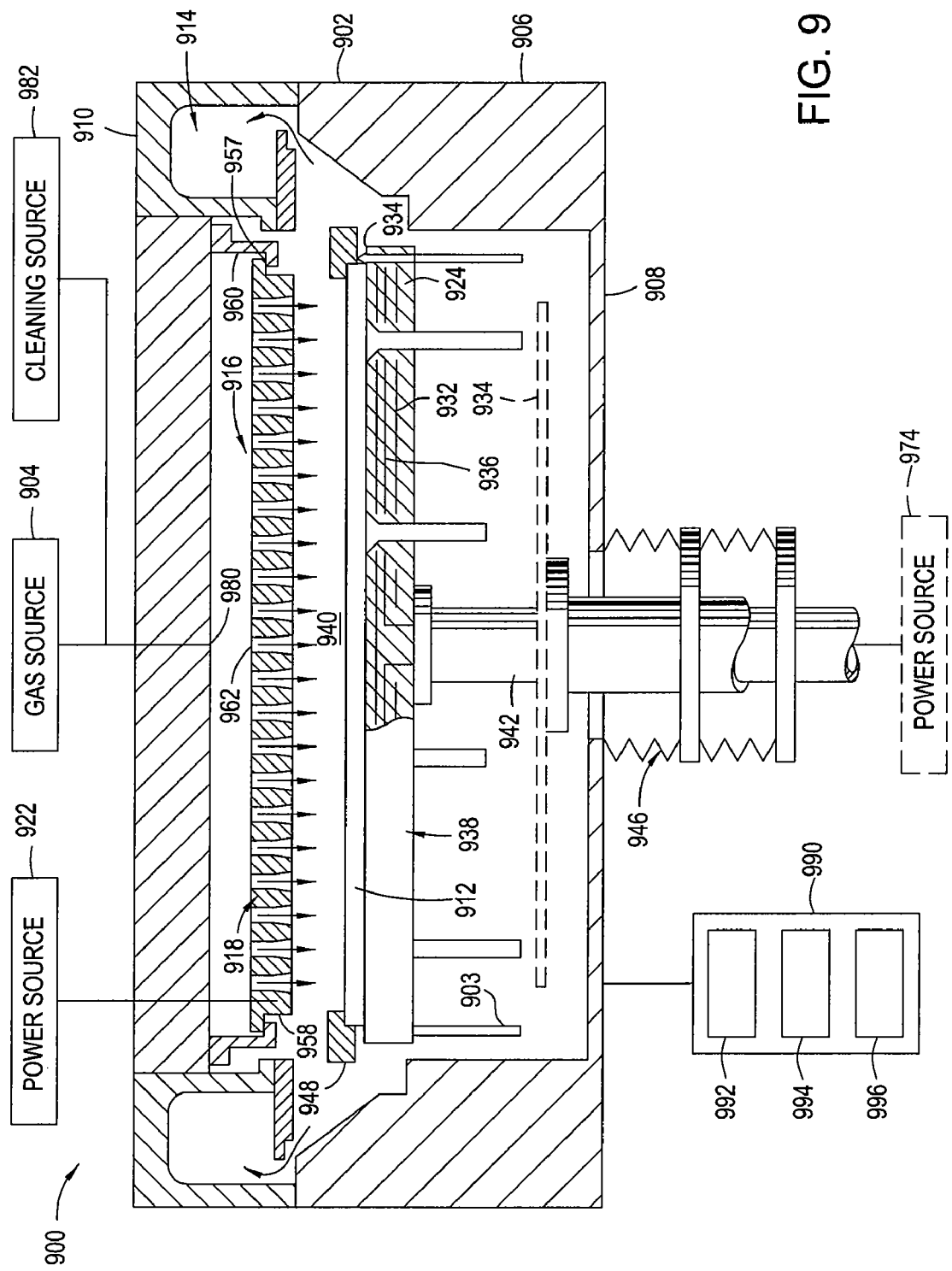
FIG. 9 is a cross-sectional schematic view of an illustrative processing chamber according to one embodiment of the invention.

FIG. 9 illustrates an exemplary processing chamber 900 according to one embodiment of the invention. The invention is illustratively described below in reference to a plasma enhanced chemical vapor deposition processing chamber for processing large area substrates is PECVD 55K Chamber™ available from AKT, a division of Applied Materials, Inc., Santa Clara, Calif. However, it should be understood that the invention has utility in other system configurations.

The processing chamber 900 includes a chamber body 902 having walls 906 and a bottom 908 that partially define a process volume 940. The process volume 940 is typically accessed through a port and a valve (not shown) to facilitate movement of a substrate 912, such as a large area glass substrate, into and out of the processing chamber 900. The walls 906 support a lid assembly 910 that contains a pumping plenum 914 that couples the process volume 940 to an exhaust port (that includes various pumping components, not shown) for exhausting any gases and process by-products out of the processing chamber 900. The processing chamber 900 is usually coupled to one or more supply sources 904 for delivery of one or more source compounds and/or precursors, for example, a silicon-containing compound supply source, a oxygen-containing compound supply source, a hydrogen gas supply source, a nitrogen-containing compound supply source, among others, and/or combinations thereof.

A substrate support assembly 938 is generally disposed on the bottom of the chamber body 902. The support assembly 938 generally is grounded such that RF power supplied by a power source 922 to a gas distribution plate assembly 918 positioned between the lid assembly 910 and the substrate support assembly 938 (or other electrode positioned within or near the lid assembly 910 of the processing chamber 900) may excite gases, source compounds, and/or precursors present in the process volume 940 between the substrate support assembly 938 and the gas distribution plate assembly 918.

The RF power from the power source 922 is generally selected commensurate with the size of the substrate 912 to drive the chemical vapor deposition process. In one embodiment, a RF power of about 400 W or larger, such as between about 2,000 W to about 4,000 W or between about 10,000 W to about 20,000 W, can be applied to the power source 922 to generate an electric field in the process volume 940. For example, a power density of about 0.2 watts/cm$^2$ or larger, such as between about 0.2 watts/cm$^2$ to about 0.8 watt/cm$^2$, or about 0.45 watts/cm$^2$, can be used to be compatible with the substrate deposition method of the invention. The power source 922 and matching network (not shown) create and sustain a plasma of the process gases from the precursor gases in the process volume 940. Preferably high frequency RF power of 13.56 MHz can be used, but this is not critical and lower frequencies can also be used. Further, the walls of the chamber can be protected by covering with a ceramic material or anodized aluminum material.

Generally, the substrate support assembly 938 is coupled to a shaft 942 and connected to a lift system (not shown) for moving the substrate support assembly 938 between an elevated processing position (as shown) and a lowered substrate transfer position. The shaft 942 additionally provides a conduit for electrical and thermocouple leads between the substrate support assembly 938 and other components of the processing chamber 900. A bellows 946 is coupled to the substrate support assembly 938 to provide a vacuum seal between the process volume 940 and the atmosphere outside the processing chamber 900 and facilitate vertical movement of the substrate support assembly 938. The lift system of the substrate support assembly 938 is generally adjusted such that a spacing between the substrate 912 and the gas distribution plate assembly 918 is optimized, such as at about 400 mils or larger, during processing. The ability to adjust the spacing enables the process to be optimized over a wide range of deposition conditions, while maintaining the required layer uniformity over the area of a large substrate.

The substrate support assembly 938 includes a conductive body 924 having a substrate support surface 934 to support the substrate 912 thereon within the process volume 940 during substrate processing. The conductive body 924 can be made of a metal or metal alloy material which provides thermal conductivity. In one embodiment, the conductive body 924 is made of an aluminum material. However, other suitable materials can also be used. The substrate support assembly 938 additionally supports a shadow frame 948 circumscribing the substrate 912 disposed on the substrate supporting surface 934 during substrate processing.

Generally, the shadow frame 948 prevents deposition at the edge of the substrate 912 and the substrate support assembly 938 so that the substrate 912 does not stick to the support assembly 938. The shadow frame 948 is generally positioned alongside inner wall of the chamber body 902 when the substrate support assembly 938 is in a lower non-processing position (not shown). The shadow frame 948 can be engaged and aligned to the conductive body 924 of the substrate support assembly 938, when the substrate support assembly 938 is in an upper processing position, as shown in FIG. 9, by matching one or more alignment grooves on the shadow frame 948 with one or more alignment pins 903. The one or more alignment pins 903 may be optionally supported by a support pin plate 936 to be movable with the conductive body 924 during substrate loading and unloading.

The substrate support assembly 938 which is temperature controlled may also include one or more electrodes and/or heating elements 932 coupled to a power source 974 to controllably heat the substrate support assembly 938 and the substrate 912 positioned thereon to a predetermined temperature range, for example, a set point temperature of about 100° C. or greater, such as about 300° C. or greater or between about 330° C. and about 370° C. In one embodiment, the one or more heating elements 932 are embedded within the conductive body 924.

The lid assembly 910 typically includes an entry port 980 through which process gases provided by the supply source 904 are introduced into the processing chamber 900. The entry port 980 is also coupled to a cleaning source 982 to provide a cleaning agent, such as disassociated fluorine, into the processing chamber 900 to remove deposition by-products and layers from processing chamber hardware, including the gas distribution plate assembly 918.

The gas distribution plate assembly 918 is typically configured to substantially follow the profile of the substrate 912, for example, rectangular for large area substrates and circular for wafers. The gas distribution plate assembly 918 includes a perforated area 916 through which precursors and other gases, such as hydrogen gas, supplied from the supply source 904 are delivered to the process volume 940. The perforated area 916 is configured to provide uniform distribution of gases passing through the gas distribution plate assembly 918 into the processing chamber 900. The gas distribution plate assembly 918 typically includes a diffuser plate 958 suspended from a hanger plate 960. A plurality of gas passages 962 are formed through the diffuser plate 958 to allow a predetermined distribution of gas passing through the gas distribution plate assembly 918 and into the process volume 940.

The diffuser plate 958 may be positioned above the substrate 940 and suspended vertically by a diffuser gravitational support. In one embodiment, the diffuser plate 958 is supported from the hanger plate 960 of the lid assembly 910 through a flexible suspension 957. The flexible suspension 957 is adapted to support the diffuser plate 958 from its edges to allow expansion and contraction of the diffuser plate 958. The flexible suspension 957 may have different configuration utilized to facilitate the expansion and contraction of the diffuser plate 958. One example of the flexible suspension 957 is disclosed in detail by U.S. Pat. No. 6,477,980, which issued Nov. 12, 2002 with the title "Flexibly Suspended Gas Distribution Manifold for A Plasma Chamber" and is herein incorporated by reference.

A controller 990 is included to interface with and control various components of the processing chamber 900. The controller 990 typically includes a central processing unit (CPU) 994, support circuits 996 and a memory 992. The CPU 994 may be one of any forms of computer processors that can be used in an industrial setting for controlling various chambers, apparatuses, and chamber peripherals. The memory 992, any software, or any computer-readable medium coupled to the CPU 994 may be one or more readily available memory devices, such as random access memory (RAM), read only memory (ROM), hard disk, CD, floppy disk, or any other form of digital storage, for local or remote for memory storage. The support circuits 996 are coupled to the CPU 994 for supporting the CPU 994 in a conventional manner. These circuits include cache, power supplies, clock circuits, input/output circuitry, subsystems, and the like.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    depositing a first silicon-containing material layer having a first etch rate on the substrate surface from a silicon-containing precursor and a nitrogen-containing precursor, the nitrogen-containing precursor introduced into a processing chamber at a first flow rate;
    depositing a second silicon-containing material layer having a second etch rate different than the first etch rate on the first silicon-containing material layer from the silicon-containing precursor and the nitrogen-containing precursor, the nitrogen-containing precursor having a second flow rate different than the first flow rate;
    etching the first silicon-containing material layer and the second silicon-containing material layer; and
    forming a taper etch profile in the first silicon-containing material layer and the second silicon-containing material layer.

2. The method of claim 1, wherein the first flow rate is greater than the second flow rate, the first etch rate is greater than the second etch rate, and the taper etch profile tapers from the substrate surface towards the second silicon-containing material layer.

3. The method of claim 2, wherein the taper etch profile forms an angle less than 90 degrees with the substrate surface from the etched sidewalls of the first silicon-containing material layer to the etched sidewalls of the second silicon-containing material layer.

4. The method of claim 1, wherein the first flow rate is less than the second flow rate, the first etch rate is less than the second etch rate and the taper etch profile tapers from the second silicon-containing material layer towards the substrate surface.

5. The method of claim 4, wherein the taper etch profile forms an angle less than 90 degrees with the substrate surface from the etched sidewalls of the second silicon-containing material layer to the etched sidewalls of the first silicon-containing material layer.

6. The method of claim 1, wherein the first silicon-containing material layer and the second silicon-containing material layer comprise silicon oxide.

7. The method of claim 6, wherein the first etch rate is a wet etch rate between about 2000 Å/min and about 3000 Å/min and the second etch rate is a wet etch rate less than about 2000 Å/min.

8. The method of claim 7, wherein the nitrogen-containing precursor comprises nitrous oxide ($N_2O$).

9. The method of claim 1, wherein the first silicon-containing material layer and the second silicon-containing material layer comprise silicon nitride.

10. The method of claim 9, wherein etching of the dual material layer is performed by wet etch and wherein the first etch rate is a wet etch rate between about 300 Å/min and about 500 Å/min and the second etch rate is a wet etch rate less than about 300 Å/min.

11. The method of claim 9, wherein the nitrogen-containing precursor comprises ammonia gas ($NH_3$).

12. The method of claim 1, wherein the nitrogen-containing precursor comprises a mixture of nitrogen ($N_2$) gas and hydrogen ($H_2$) gas with the second flow rate of the nitrogen gas less than the first flow rate of the nitrogen gas and wherein the hydrogen gas increases and has a first flow rate of zero and a second flow rate of hydrogen gas greater than the first flow rate of hydrogen gas.

13. The method of claim 1, wherein the first silicon-containing material layer comprises silicon oxide and the second silicon-containing material layer comprises silicon nitride.

14. The method of claim 13, wherein the selectivity of the first etch rate versus the second etch rate is about 10:1 to about 20:1.

15. The method of claim 1, wherein the depositing a first silicon-containing material layer and depositing a second silicon-containing material layer are performed in a continuous manner in the same processing chamber.

16. The method of claim 15, wherein the second flow rate of the nitrogen-containing precursor increases or decreases continuously from the first flow rate.

17. The method of claim 1, wherein the dual material layer is deposited on a substrate for fabricating a device selected from the group consisting of surface-conduction electron-emitter display (SED), liquid crystal display (LCD), plasma display panels (PDP), field emission display (FED), and organic light emitting diode (OLED).

18. A method for processing a substrate, comprising:
depositing a first silicon-containing material layer having a first etch rate on the substrate surface from a silicon-containing precursor and a nitrogen-containing precursor, the nitrogen-containing precursor introduced into a processing chamber at a first flow rate;
adjusting the flow rate of the of the nitrogen-containing precursor to a second flow rate different than the first flow rate;
depositing in situ a second silicon-containing material layer having a second etch rate different than the first etch rate;
etching the first silicon-containing material layer and the second silicon-containing material layer; and
forming an etch profile in the first silicon-containing material layer and the second silicon-containing material layer, the etch profile forming an etch angle less than 90° with the substrate surface from the etched sidewalls of the first silicon-containing material layer to the etched sidewalls of the second silicon-containing material layer.

19. The method of claim 18, wherein the first silicon-containing material layer and the second silicon-containing material layer comprise silicon oxide, silicon nitride, or combinations thereof.

20. The method of claim 18, wherein the nitrogen-containing precursor comprises a gas selected from the group consisting of nitrous oxide ($N_2O$), ammonium gas ($NH_3$), nitrogen gas ($N_2$), and combinations thereof.

21. The method of claim 20, wherein the processing gas further comprises hydrogen gas.

22. The method of claim 18, wherein the dual material layer is deposited on a substrate for fabricating a device selected from the group consisting of surface-conduction electron-emitter display (SED), liquid crystal display (LCD), plasma display panels (PDP), field emission display (FED), and organic light emitting diode (OLED).

23. A method for processing a substrate, comprising:
depositing a first silicon-containing material layer having a first etch rate on the substrate surface from a first nitrogen-containing precursor and a silicon-containing precursor;
depositing a second silicon-containing material layer having a second etch rate different than the first etch rate on the first silicon-containing material layer from a second nitrogen-containing precursor and the silicon-containing precursor;
etching the first silicon-containing material layer and the second silicon-containing material layer; and
forming an etch profile in the first silicon-containing material layer and the second silicon-containing material layer, the etch profile forming an etch angle less than 90° with the substrate surface from the etched sidewalls of the first silicon-containing material layer to the etched sidewalls of the second silicon-containing material layer.

24. The method of claim 23, wherein one of either the first nitrogen-containing precursor or the second nitrogen-containing precursor comprises nitrogen oxide ($N_2O$) and the remaining first nitrogen-containing precursor or second nitrogen-containing precursor comprises a gas selected from the group consisting of ammonium gas ($NH_3$), nitrogen gas ($N_2$), and combinations thereof.

25. The method of claim 23, wherein the depositing a first silicon-containing material layer and depositing a second silicon-containing material layer are performed in a continuous manner in the same processing chamber.

* * * * *